(12) United States Patent
Lin et al.

(10) Patent No.: US 10,276,986 B2
(45) Date of Patent: Apr. 30, 2019

(54) ELECTRICAL CONNECTOR

(71) Applicant: LOTES CO., LTD, Keelung (TW)

(72) Inventors: Chin Chi Lin, Keelung (TW); Cheng Wei Lo, Keelung (TW)

(73) Assignee: LOTES CO., LTD, Keelung (TW)

( * ) Notice: Subject to any disclaimer, the term of this patent is extended or adjusted under 35 U.S.C. 154(b) by 0 days.

(21) Appl. No.: 15/892,798

(22) Filed: Feb. 9, 2018

(65) Prior Publication Data

US 2018/0233840 A1 Aug. 16, 2018

Related U.S. Application Data

(60) Provisional application No. 62/459,756, filed on Feb. 16, 2017.

(30) Foreign Application Priority Data

Jan. 9, 2018 (CN) .......................... 2018 1 0016925

(51) Int. Cl.
*H01L 23/40* (2006.01)
*H01R 13/6591* (2011.01)
(Continued)

(52) U.S. Cl.
CPC ..... *H01R 13/6591* (2013.01); *H01L 23/3675* (2013.01); *H01L 23/552* (2013.01); *H01R 12/53* (2013.01); *H01R 12/57* (2013.01); *H01R 12/716* (2013.01); *H01R 12/725* (2013.01); *H01R 12/732* (2013.01); *H01R 13/405* (2013.01); *H01R 13/506* (2013.01); *H01R 13/516* (2013.01); *H01R 13/5213* (2013.01);
(Continued)

(58) Field of Classification Search
CPC ...... H01L 23/36; H01L 23/3672; H01L 23/40
USPC .................................................. 361/719, 720
See application file for complete search history.

(56) References Cited

U.S. PATENT DOCUMENTS

| | | | | |
|---|---|---|---|---|
| 8,477,498 B2 * | 7/2013 | Porreca | .............. | H05K 7/20545 361/696 |
| 8,593,821 B2 * | 11/2013 | Gupta | .................... | H04B 1/082 165/185 |
| 10,141,182 B1 * | 11/2018 | Molla | ............... | H01L 21/02109 |

FOREIGN PATENT DOCUMENTS

| | | |
|---|---|---|
| CN | 201112620 Y | 9/2008 |
| CN | 103094764 A | 5/2013 |

(Continued)

*Primary Examiner* — Hien D Vu
(74) *Attorney, Agent, or Firm* — Locke Lord LLP; Tim Tingkang Xia, Esq.

(57) ABSTRACT

An electrical connector used to be electrically connected to a circuit board includes: an insulating body; a plurality of terminals, accommodated in the insulating body; a shielding shell, accommodating the insulating body and mounted to the circuit board; and at least one heat dissipation member, located on at least one side of the shielding shell and simultaneously abuts the circuit board and the shielding shell. The heat dissipation members are provided on one or more sides of the shielding shell, and simultaneously abut the shielding shell and the circuit board, so that the heat generated in the operation of the electrical connector is transferred to the heat dissipation members via the shielding shell, and the heat is further transferred to the outside and the circuit board by the heat dissipation members, thus improving the heat dissipation efficiency of the electrical connector, and ensuring the stable operation of the electrical connector.

11 Claims, 19 Drawing Sheets

(51) Int. Cl.
*H01L 23/367* (2006.01)
*H01R 12/53* (2011.01)
*H01R 12/57* (2011.01)
*H01R 12/71* (2011.01)
*H01R 12/72* (2011.01)
*H01R 12/73* (2011.01)
*H01R 13/405* (2006.01)
*H01R 13/506* (2006.01)
*H01R 13/516* (2006.01)
*H01R 13/52* (2006.01)
*H01R 13/6581* (2011.01)
*H01R 13/66* (2006.01)
*H05K 1/02* (2006.01)
*H05K 7/20* (2006.01)
*H01L 23/552* (2006.01)
*H01R 13/6594* (2011.01)

(52) U.S. Cl.
CPC ..... *H01R 13/5216* (2013.01); *H01R 13/6581* (2013.01); *H01R 13/665* (2013.01); *H05K 1/0203* (2013.01); *H05K 1/0209* (2013.01); *H05K 7/2039* (2013.01); *H05K 7/20154* (2013.01); *H01R 13/6594* (2013.01); *H05K 2201/066* (2013.01); *H05K 2201/09063* (2013.01); *H05K 2201/10189* (2013.01); *H05K 2201/10409* (2013.01); *H05K 2201/10446* (2013.01)

(56) References Cited

FOREIGN PATENT DOCUMENTS

| | | |
|---|---|---|
| CN | 203734021 U | 7/2014 |
| CN | 203839574 U | 9/2014 |
| CN | 104409913 A | 3/2015 |
| CN | 206100746 U | 4/2017 |

* cited by examiner

ELECTRICAL CONNECTOR

CROSS-REFERENCE TO RELATED PATENT APPLICATION

This non-provisional application claims priority to and the benefit of, pursuant to 35 U.S.C. § 119(e), U.S. provisional patent application Ser. No. 62/459,756 filed Feb. 16, 2017, and under 35 U.S.C. § 119(a), patent application Serial No. CN201810016925.3 filed in China on Jan. 9, 2018. The disclosures of the above applications are incorporated herein in their entireties by reference.

Some references, which may include patents, patent applications and various publications, are cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference were individually incorporated by reference.

FIELD

The present invention relates to an electrical connector, and more particularly to an electrical connector with good heat dissipation performance.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

The existing electrical connector on the market generally includes an insulating body, a plurality of terminals retained on the insulating body and a shielding shell accommodating the insulating body. When the electrical connector is mated with a mating connector and in operation, heat will be generated. If the heat cannot be timely dissipated to the outside, the temperature of the electrical connector may increase, so that the performance of the electrical connector is affected, the service life of the electrical connector is greatly shortened, the electrical connector cannot work normally, and there may be safety hazards such as causing a fire. Meanwhile, other electronic components located on the same circuit board with the electrical connector may also be affected by the high temperature and cannot work normally.

Currently, in order to improve the heat dissipation performance of the electrical connector, a heat dissipation member is generally provided on the electrical connector to be in contact with the shielding shell, so that the heat generated in the operation of the electrical connector is transferred to the outside by the heat dissipation member. However, with the increasing quantity of components on the circuit board, the size of the heat dissipation member must be gradually reduced, thus causing a poor heat dissipation effect of the heat dissipation member on the electrical connector.

Therefore, a heretofore unaddressed need to design an improved electrical connector exists in the art to address the aforementioned deficiencies and inadequacies.

SUMMARY

In view of the problems in the related art, the present invention is directed to an electrical connector with good heat dissipation performance. A heat dissipation member is disposed to simultaneously abut a shielding shell of the electrical connector and a circuit board, so that the heat inside the electrical connector is transferred to the outside and the circuit board via the heat dissipation member, thus improving the heat dissipation efficiency of the electrical connector.

To achieve the foregoing objective, the present invention uses the following technical solutions.

An electrical connector, configured to be electrically connected to a circuit board, includes: an insulating body; a plurality of terminals, accommodated in the insulating body; a shielding shell, accommodating the insulating body and configured to be mounted to the circuit board; and at least one heat dissipation member, located on at least one side of the shielding shell, where the at least one heat dissipation member simultaneously abuts the circuit board and the shielding shell.

In certain embodiments, there is one heat dissipation member, and the heat dissipation member is only located on one side of the shielding shell.

In certain embodiments, there are at least two heat dissipation members, and the at least two heat dissipation members are located on at least two sides of the shielding shell in a transverse direction and formed integrally or disposed separately.

In certain embodiments, there are two heat dissipation members, and the two heat dissipation members are respectively located on a left side and a right side of the shielding shell and disposed separately.

In certain embodiments, there are two heat dissipation members, and the two heat dissipation members are respectively located on a left side and a rear side of the shielding shell and disposed integrally.

In certain embodiments, there are three heat dissipation members, and the three heat dissipation members are respectively located on a left side, a right side and a rear side of the shielding shell and formed integrally.

In certain embodiments, the at least one heat dissipation member comprises at least one first heat dissipation member and at least one second heat dissipation member, the at least one first heat dissipation member is located on at least one side of the shielding shell in a transverse direction, the at least one second heat dissipation member is located on at least one side of the shielding shell in a vertical direction, and the at least one first heat dissipation member and the at least one second heat dissipation member are disposed integrally or separately.

In certain embodiments, the at least one first heat dissipation member is located on a rear side of the shielding shell, the at least one second heat dissipation member is located on a upper side of the shielding shell, and the at least one first heat dissipation member and the at least one second heat dissipation member are disposed separately.

In certain embodiments, at least one fixing portion fixes the at least one heat dissipation member to the circuit board, the at least one fixing portion is provided with a fixing hole, the circuit board is provided with a through hole corresponding to the fixing hole, and a locking member penetrates through the fixing hole and the through hole.

In certain embodiments, there are at least three heat dissipation members respectively located on a left side, a right side and a rear side of the shielding shell, and two fixing portions respectively extend from the heat dissipation members on the left side and the right side of the shielding shell.

In certain embodiments, the at least one heat dissipation member is provided with a reserved portion not abutting the circuit board, and the reserved portion is spaced away from the circuit board to form a reserved space.

In certain embodiments, the at least one heat dissipation member is located on an upper side or a lower side of the shielding shell, the at least one heat dissipation member is provided with a first abutting surface abutting the circuit board, the at least one heat dissipation member is recessed to form a recessed space and is provided with a second abutting surface located in the recessed space; and the shielding shell abuts the second abutting surface in the recessed space.

In certain embodiments, the circuit board is provided with a sunken plate groove, the shielding shell is mounted in the sunken plate groove, and the at least one heat dissipation member is located on the lower side of the shielding shell.

In certain embodiments, the shielding shell comprises an inner shell and an outer shell, the inner shell is accommodated in the insulating body, and the outer shell is sleeved over the inner shell and provided with at least one mounting leg configured to fix the outer shell to the circuit board.

In certain embodiments, the circuit board is provided with a metal layer, and the shielding shell and the at least one heat dissipation member abut the metal layer.

In certain embodiments, the electrical connector further includes a mating connector, wherein the mating connector is provided with a built-in plate and at least one metal shell surrounding the built-in plate, and the built-in plate is provided with a chip.

In certain embodiments, the metal shell is provided with at least one abutting portion abutting the chip.

In certain embodiments, the insulating body is provided with a base and a tongue extending forward from the base, and the terminals are retained to the base in an upper row and a lower row and partially exposed to an upper surface and a lower surface of the tongue.

The present invention further provides another technical solution, where an electrical connector, configured to be electrically connected to a circuit board, includes: an insulating body; a plurality of terminals, accommodated in the insulating body; a shielding shell, accommodating the insulating body and configured to be mounted to the circuit board; and at least one heat dissipation member, located on at least one of a left side, a right side and a lower side of the shielding shell, where the at least one heat dissipation member simultaneously abuts the circuit board and the shielding shell.

In certain embodiments, there are at least two heat dissipation members, and the at least two heat dissipation members are respectively located on at least two sides of the left side, the right side and the lower side of the shielding shell.

Compared with the related art, the present invention has the following advantages:

The electrical connector of the present invention is provided with the heat dissipation members on one or more sides of the shielding shell, and the heat dissipation members simultaneously abut the shielding shell and the circuit board, so that the heat generated in the operation of the electrical connector is transferred to the heat dissipation members via the shielding shell, and the heat is further transferred to the outside and the circuit board by the heat dissipation members, thus improving the heat dissipation efficiency of the electrical connector, and ensuring the stable operation of the electrical connector. The heat dissipation members simultaneously abut the shielding shell and the circuit board, thus reducing the size of the heat dissipation members and saving the space on the circuit board.

These and other aspects of the present invention will become apparent from the following description of the preferred embodiment taken in conjunction with the following drawings, although variations and modifications therein may be effected without departing from the spirit and scope of the novel concepts of the disclosure.

BRIEF DESCRIPTION OF THE DRAWINGS

The accompanying drawings illustrate one or more embodiments of the disclosure and together with the written description, serve to explain the principles of the disclosure. Wherever possible, the same reference numbers are used throughout the drawings to refer to the same or like elements of an embodiment, and wherein.

DETAILED DESCRIPTION

Figure 1:
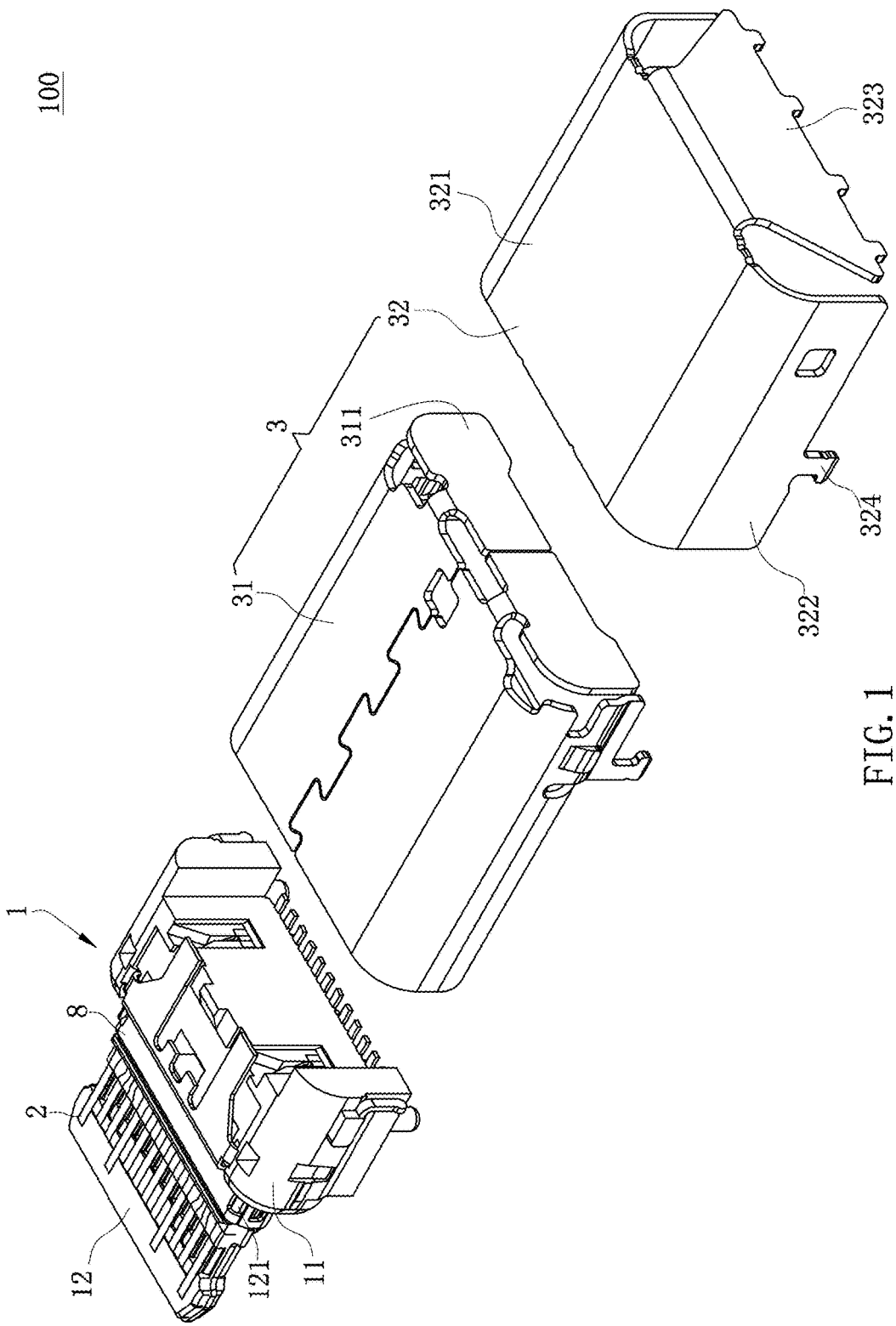
FIG. 1 is a perspective exploded view of an electrical connector according to certain embodiments of the present invention.

The present invention is more particularly described in the following examples that are intended as illustrative only since numerous modifications and variations therein will be apparent to those skilled in the art. Various embodiments of the invention are now described in detail. Referring to the drawings, like numbers indicate like components throughout the views. As used in the description herein and throughout the claims that follow, the meaning of "a", "an", and "the" includes plural reference unless the context clearly dictates otherwise. Also, as used in the description herein and throughout the claims that follow, the meaning of "in" includes "in" and "on" unless the context clearly dictates otherwise. Moreover, titles or subtitles may be used in the specification for the convenience of a reader, which shall have no influence on the scope of the present invention.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

As used herein, the terms "comprising", "including", "carrying", "having", "containing", "involving", and the like are to be understood to be open-ended, i.e., to mean including but not limited to.

The description will be made as to the embodiments of the present invention in conjunction with the accompanying drawings in FIGS. 1-19. In accordance with the purposes of this invention, as embodied and broadly described herein, this invention, in one aspect, relates to an electrical connector.

Figure 2:
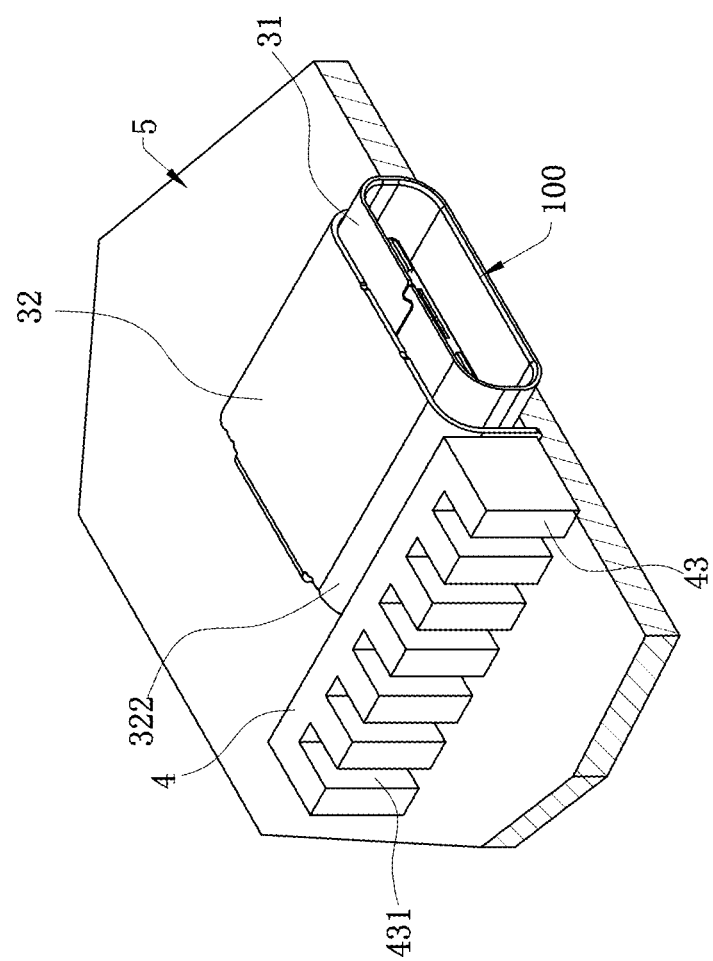
FIG. 2 is a structural view of the electronic device according to a first embodiment of the present invention.

As shown in FIGS. 1 and 2, an electrical connector 100 of the present invention is configured to be electrically connected to a circuit board 5, and includes an insulating body 1, a plurality of terminals 2 accommodated in the insulating body 1, a shielding shell 3 accommodating the insulating body 1 and mounted to the circuit board 5, and at least one heat dissipation member 4, located on at least one side of the shielding shell 3 and simultaneously abutting the shielding shell 3 and the circuit board 5.

As shown in FIG. 1, the insulating body 1 is provided with a base 11 and a tongue 12 extending forward from the base 11. The tongue 12 is provided with a root 121 close to the base 11. The thickness of the root 121 is smaller than the thickness of the base 11, and the thickness of the root 121 is greater than a thickness of the tongue 12 at a location away from the base 11.

The terminals 2 are retained on the base 11 in upper and lower rows, and partially exposed to upper and lower surfaces of the tongue 12.

At least one grounding sheet 8 is provided. In this embodiment, there are two grounding sheets 8, and the two grounding sheets 8 cover the root 121 and part of the base 11 and are buckled and fixed together.

Figure 7:
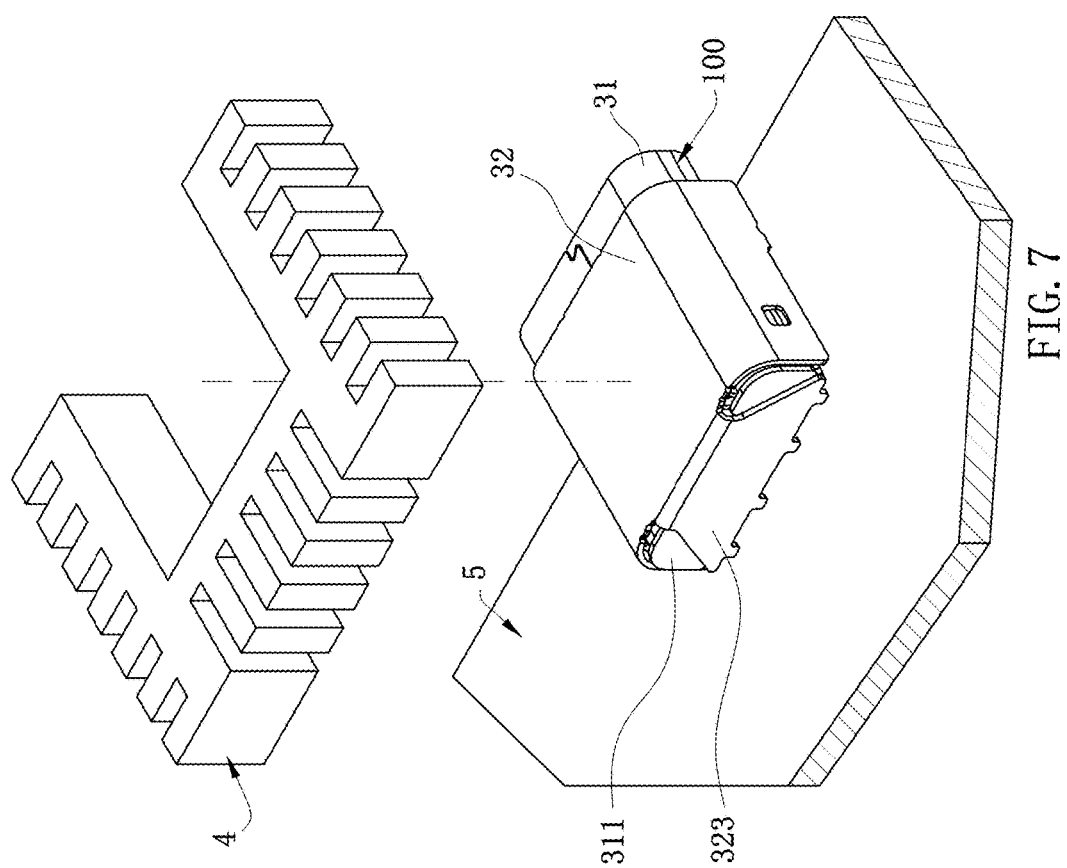
FIG. 7 is a perspective exploded view of the electrical connector viewed from another viewing angle according to the second embodiment of the present invention.

As shown in FIGS. 1 and 7, the shielding shell 3 includes an inner shell 31 and an outer shell 32. The inner shell 31 is accommodated in the insulating body 1. The inner shell 31 is provided with a rear cover 311, and the rear cover 311 is attached to a rear end surface of the insulating body 1. The outer shell 32 is sleeved over the inner shell 31, and the outer shell 32 includes a top wall 321, two side walls 322 and a rear wall 323. The top wall 321 is attached to a top surface of the inner shell 31. The two side walls 322 respectively bend and extend toward the inner shell 31 from the two sides of the top wall 321. The rear wall 323 bends and extends toward the rear cover 311 from a rear end of the top wall 321. The rear wall 323 is attached to the rear cover 311, and each of the side walls 322 and the rear wall 323 extends downward to form at least one mounting leg 324. The circuit board 5 is provided with a plurality of mounting holes (not shown in the figures, similarly hereinafter), and the mounting legs 324 are fixed in the mounting holes for fixing the outer shell 32 to the circuit board 5.

Figure 3:
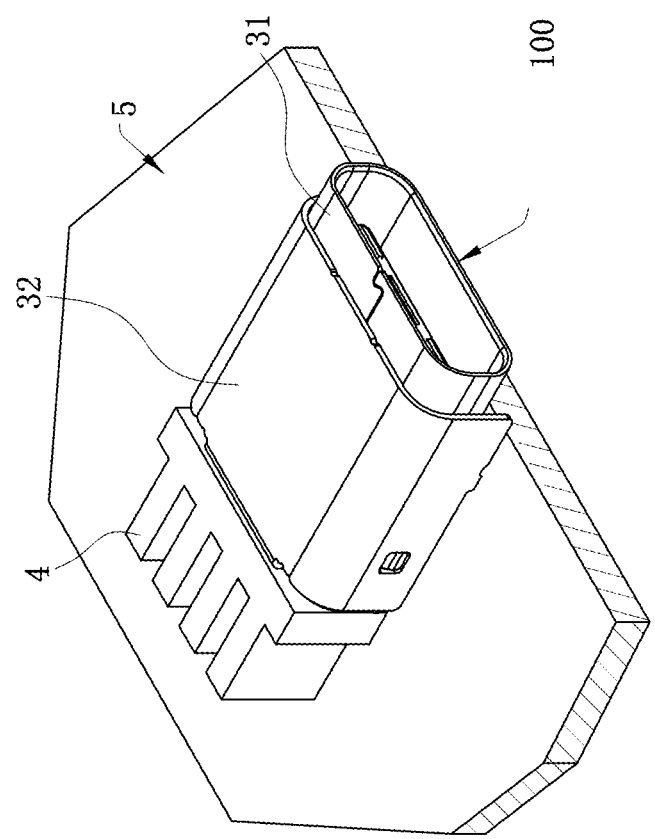
FIG. 3 is another structural view of the electrical connector according to the first embodiment of the present invention.
Figure 17:
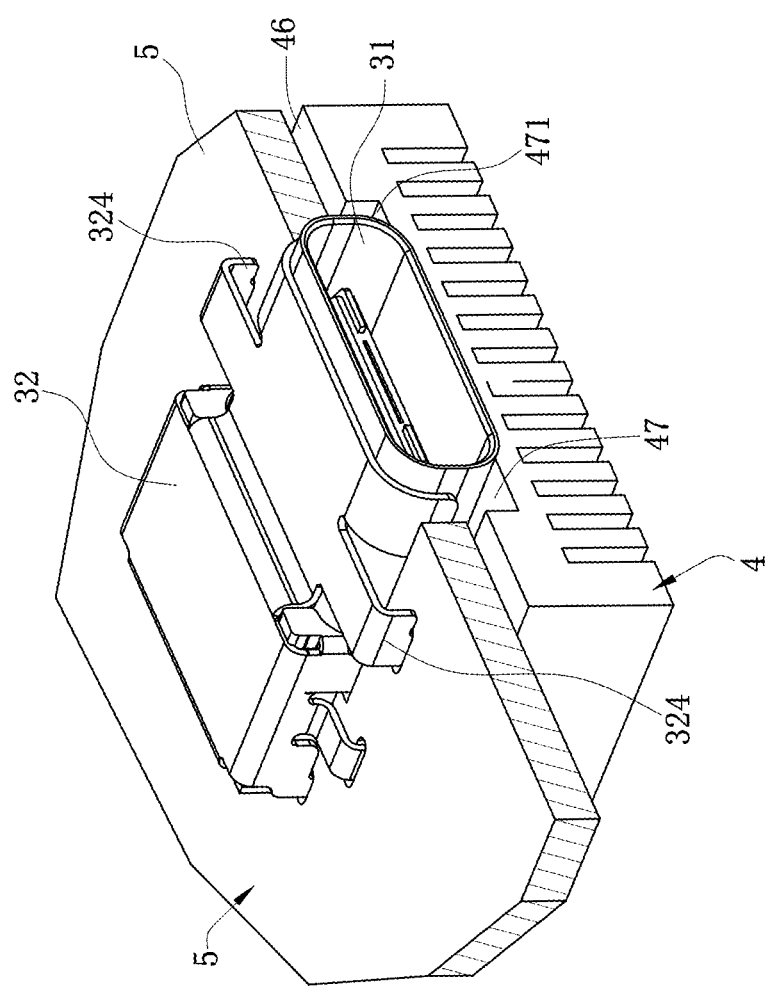
FIG. 17 is a perspective assembled view of the electrical connector according to a seventh embodiment of the present invention.

FIG. 2 shows a first embodiment of the present invention, where the heat dissipation member 4 is mounted to the circuit board 5 and abuts the circuit board 5. The heat dissipation member 4 is provided with a plurality of fins 43, and a heat dissipation space 431 is formed between the two adjacent fins 43. The heat dissipation member 4 is located on one side of the inner shell 31 and the outer shell 32. In this embodiment, the heat dissipation member 4 is located on the left side or the right side of the inner shell 31 and the outer shell 32, and the heat dissipation member 4 abuts the side walls 322. As shown in FIG. 17, in another embodiment, the heat dissipation member 4 is located on the lower side of the inner shell 31 and the outer shell 32, and the heat dissipation member 4 abuts the bottom surface of the inner shell 31. As shown in FIG. 3, the heat dissipation member 4 can further be located on the rear side of the inner shell 31 and the outer shell 32, and the heat dissipation member 4 abuts the rear wall 323. The heat dissipation member 4 can simultaneously abut the outer shell 32 and the inner shell 31. These embodiments all fall in the protection scope of the present invention and are thus not further elaborated herein.

Figure 8:
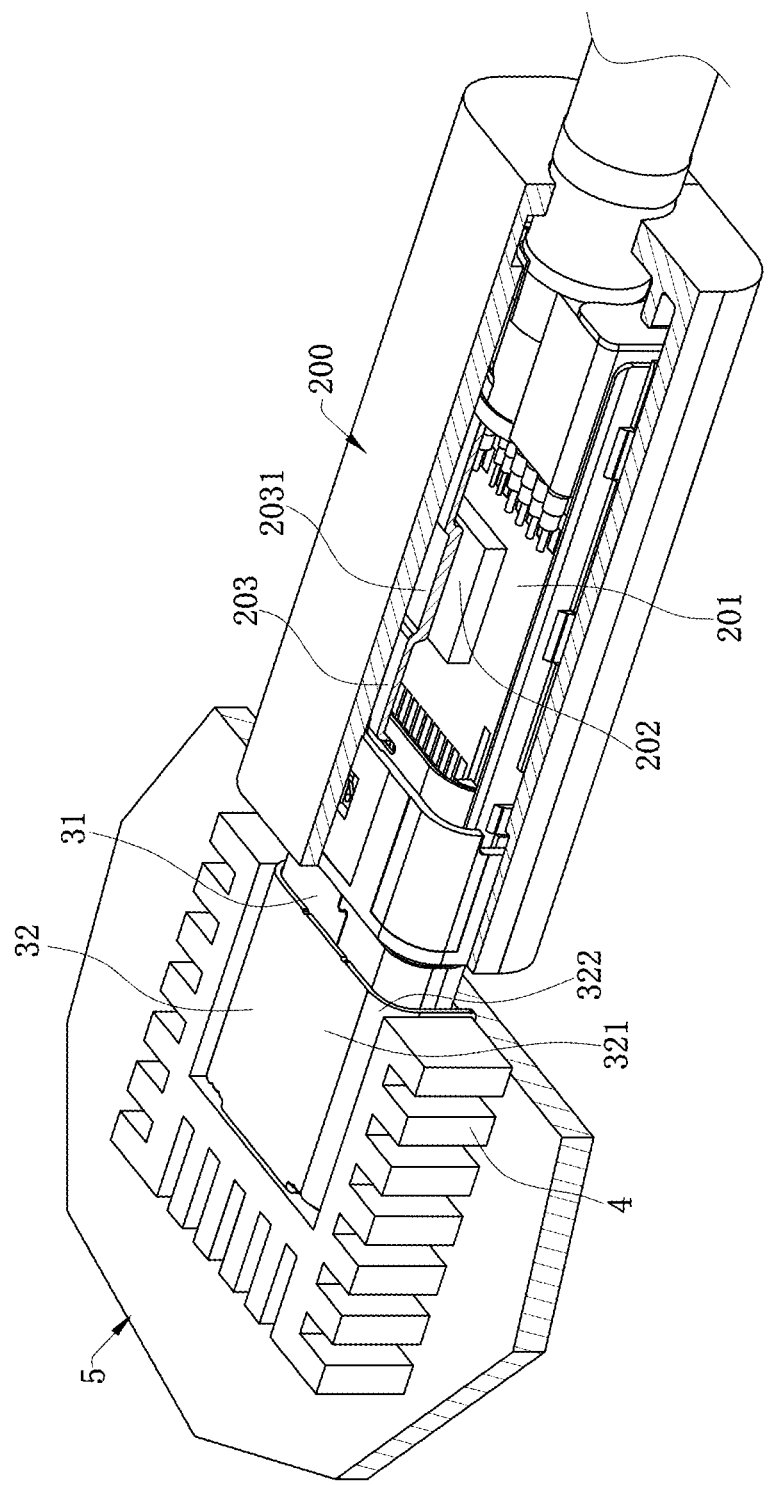
FIG. 8 is a schematic view of an electrical connector mated with a mating connector according to certain embodiments of the present invention.

As shown in FIG. 8, the electrical connector 100 is mated with a mating connector 200. The mating connector 200 includes a built-in plate 201 and at least one metal shell 203 surrounding the built-in plate 201. The built-in plate 201 is provided with a chip 202. The metal shell 203 is provided with an abutting portion 2031 abutting the chip 202, and the heat generated in the operation of the chip 202 is transferred to the metal shell 203 via the abutting portion 2031. When the electrical connector 100 is mated with the mating connector 200, the metal shell 203 abuts the inner shell 31 and the grounding sheet 8, and the metal shell 203 abuts the grounding sheet 8 to strengthen the grounding effect. The metal shell 203 transfers the heat to the inner shell 31, then the inner shell 31 further transfers the heat to the outer shell 32, and the outer shell 32 transfers the heat to the outside and the circuit board 5 via the heat dissipation member 4, thereby accelerating the heat dissipation of the electrical connector 100 and ensuring that the electrical connector 100 operates stably.

Figure 4:
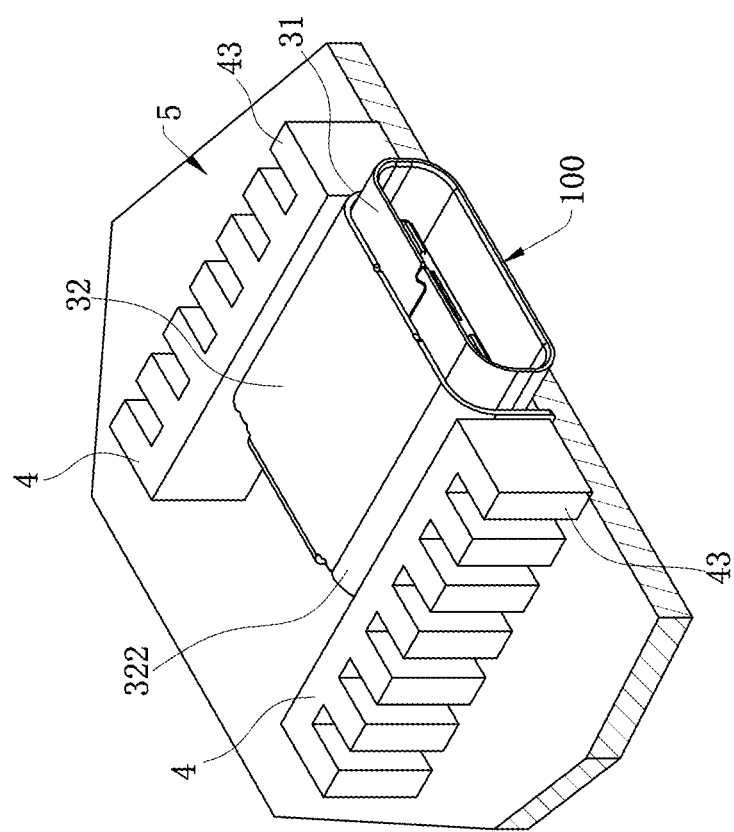
FIG. 4 is a structural view of the electrical connector according to a second embodiment of the present invention.
Figure 5:
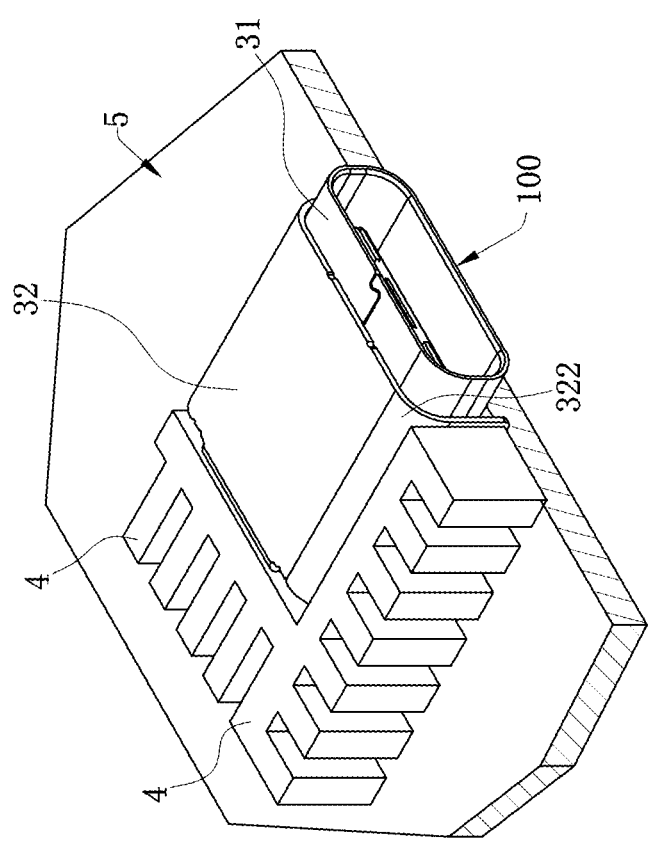
FIG. 5 is another structural view of the electrical connector according to the second embodiment of the present invention.
Figure 6:
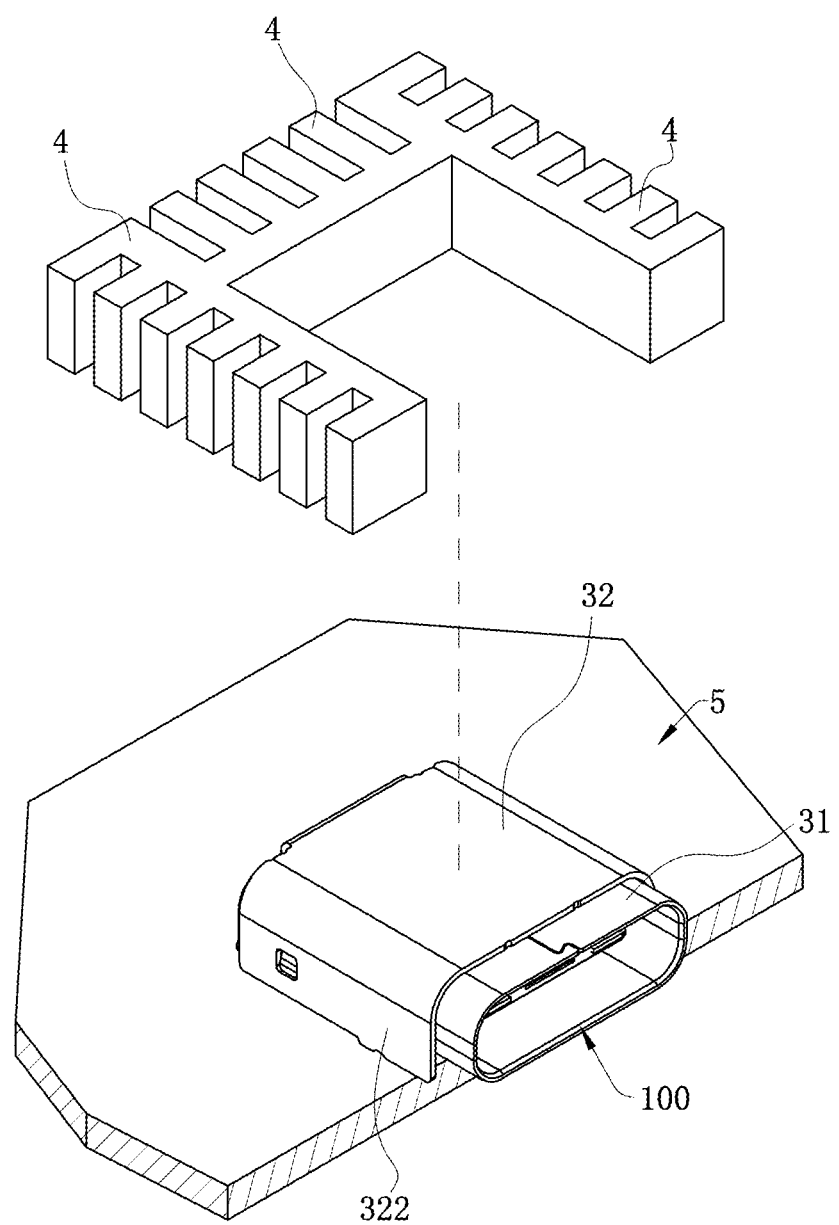
FIG. 6 is a perspective exploded view of the electrical connector according to the second embodiment of the present invention.

FIG. 4 shows a second embodiment of the present invention, which is different from the first embodiment in that at least two heat dissipation members 4 are located on at least two sides of the inner shell 31 and the outer shell 32 in a transverse direction, and the at least two heat dissipation members 4 are formed integrally or disposed separately. In this embodiment, there are two heat dissipation members 4. The two heat dissipation members 4 are respectively located on the left side and the right side of the inner shell 31 and the outer shell 32, and the two heat dissipation members 4 are disposed separately. As shown in FIG. 5, in another embodiment, the two heat dissipation members 4 are respectively located on the left side and the rear side of the inner shell 31, and the outer shell 32 and the two heat dissipation members 4 are formed integrally. As shown in FIGS. 6 and 7, in another embodiment, there are three heat dissipation members 4. The three heat dissipation members 4 are respectively located on the left side, the right side and the rear side of the inner shell 31 and the outer shell 32, and the three heat dissipation members 4 are formed integrally. By providing multiple heat dissipation members 4 in the transverse direction of the inner shell 31 and the outer shell 32, the heat inside the electrical connector 100 is transferred to the outside and the circuit board 5 more quickly via the heat dissipation members 4, so that the heat dissipation is accelerated and the stable operation of the electrical connector 100 is ensured.

Figure 9:
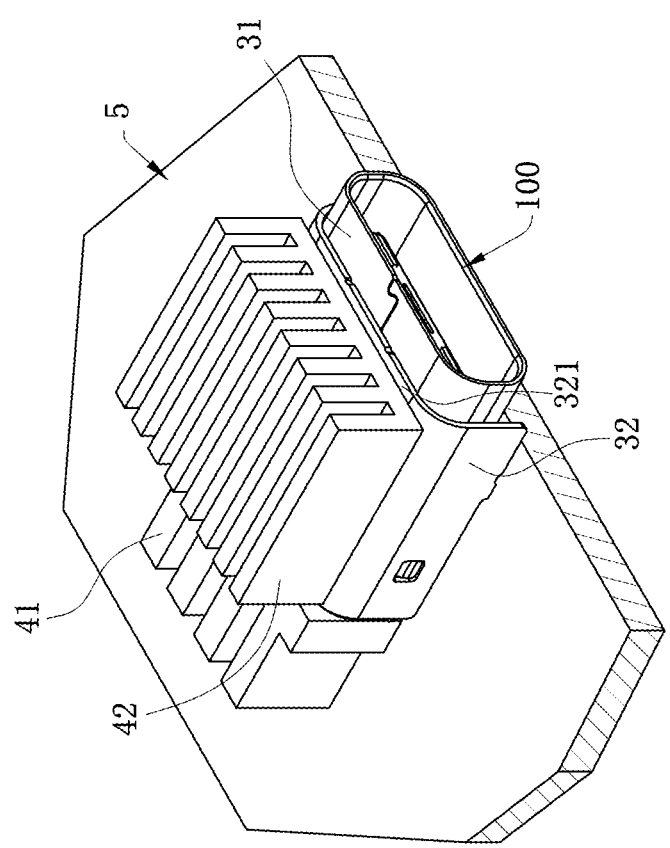
FIG. 9 is a structural view of a third embodiment of the electrical connector according to the present invention.
Figure 10:
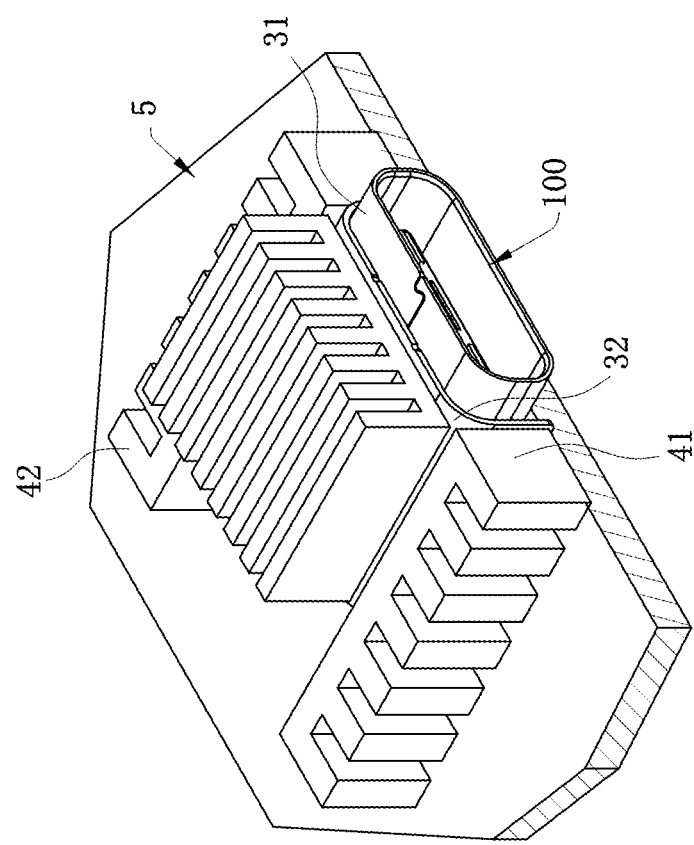
FIG. 10 is another structural view of the electrical connector according to the third embodiment of the present invention.

FIG. 9 shows a third embodiment of the present invention, which is different from the second embodiment in that the heat dissipation members 4 are located on at least one side of the inner shell 31 and the outer shell 32. The heat dissipation members 4 includes at least one first heat dissipation member 41 and at least one second heat dissipation member 42. The first heat dissipation member 41 and the second heat dissipation member 42 are formed integrally or disposed separately. In this embodiment, the first heat dissipation member 41 is located on the rear side of the inner shell 31 and the outer shell 32, the second heat dissipation member 42 is located on the upper side of the inner shell 31 and the outer shell 32, and the first heat dissipation member 41 and the second heat dissipation member 42 are disposed separately. As shown in FIG. 10, in another embodiment, there are two first heat dissipation members 41 which are respectively located on the left and right sides of the inner shell 31 and the outer shell 32, the second heat dissipation member 42 is located on the upper side of the inner shell 31 and the outer shell 32, and the first heat dissipation members 41 and the second heat dissipation member 42 are disposed separately. By providing multiple heat dissipation members 4 in the transverse direction and the vertical direction of the inner shell 31 and the outer shell 32, the heat inside the electrical connector 100 is transferred to the outside and the circuit board 5 more quickly via the plurality of heat dissipation members 4, so that the heat dissipation is accelerated and the stable operation of the electrical connector 100 is ensured.

Figure 11:
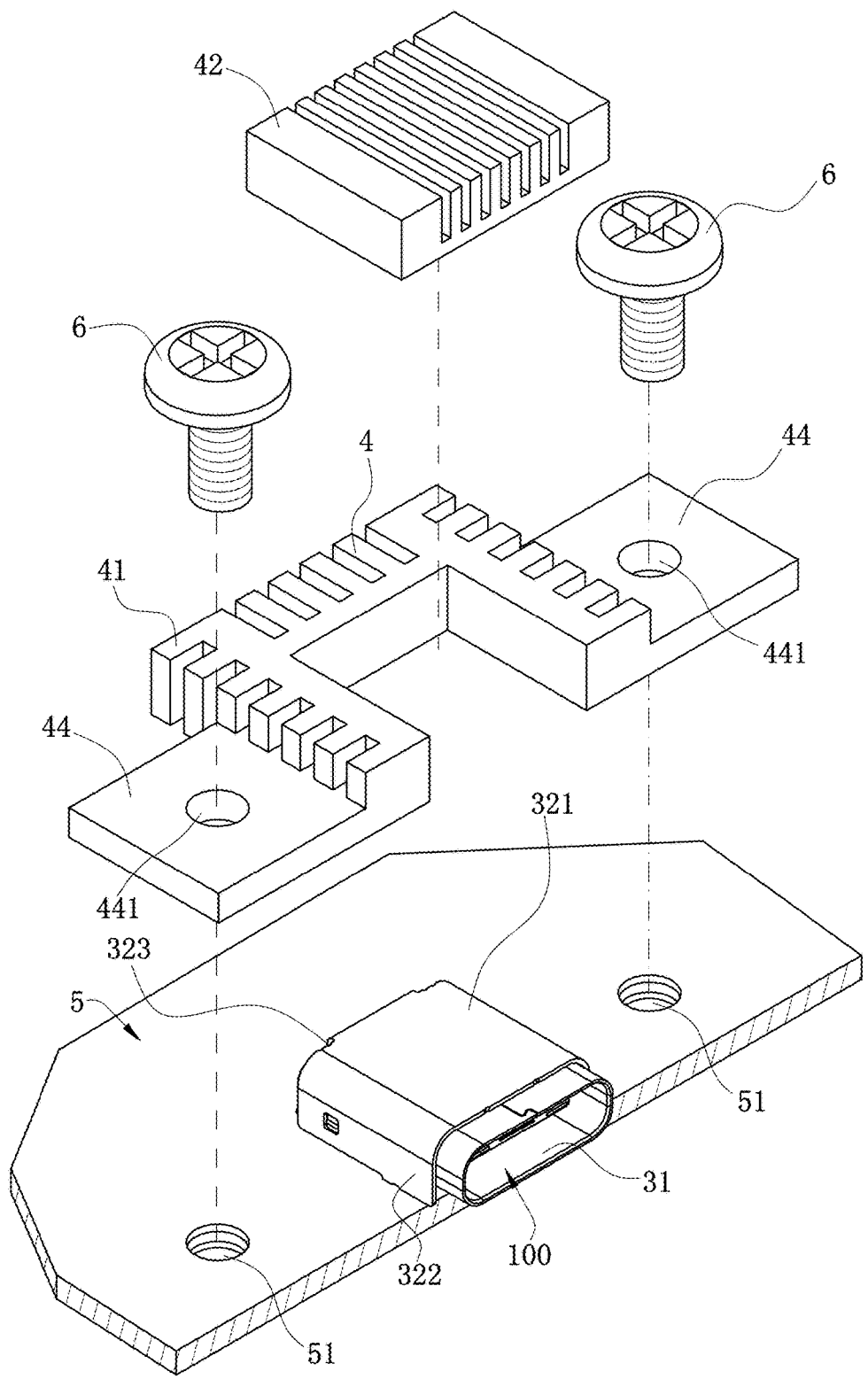
FIG. 11 is a perspective exploded view of the electrical connector according to a fourth embodiment of the present invention.
Figure 12:
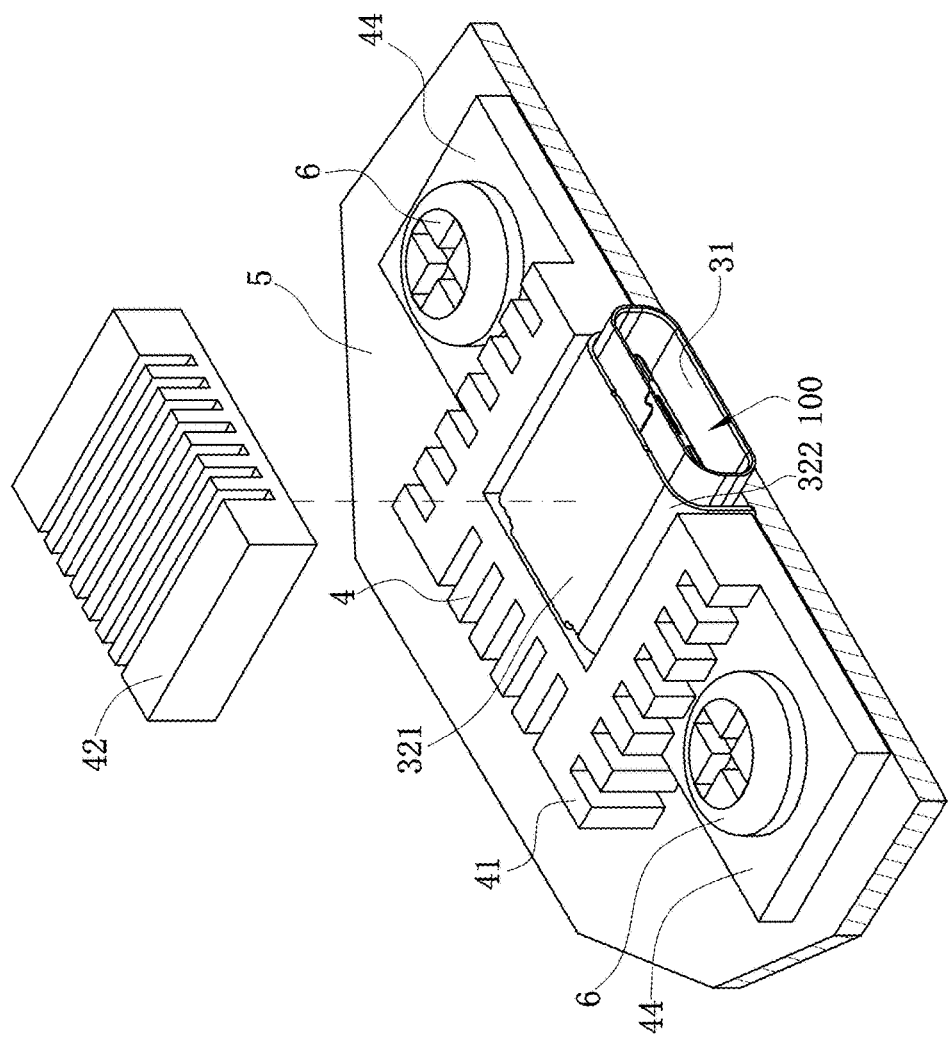
FIG. 12 is a perspective exploded view of another state of the electrical connector according to the fourth embodiment of the present invention.
Figure 13:
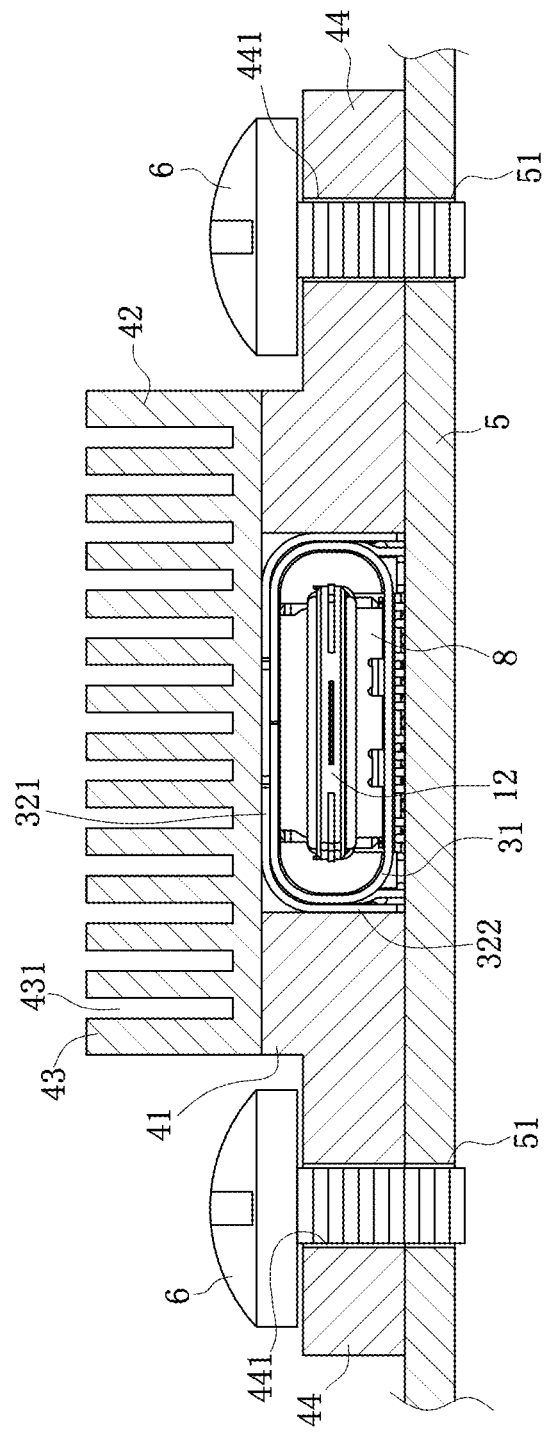
FIG. 13 is a partial sectional view of the electrical connector according to the fourth embodiment of the present invention.

FIGS. 11 and 12 show a fourth embodiment of the present invention, which is different from the third embodiment in that the first heat dissipation members 41 are located on the left side, the right side and the rear side of the inner shell 31 and the outer shell 32, and the first heat dissipation members 41 abut the side walls 322 and the rear wall 323. Two fixing portions 44 respectively extend out of the left and right sides of the first heat dissipation member 41, and each fixing portion 44 is provided with a fixing hole 441. The circuit board 5 is provided with at least one through hole 51 corresponding to the fixing holes 441, and a locking member 6 penetrates through one of the fixing holes 441 and a corresponding one of the through holes 51 to fix the first heat dissipation members 41 to the circuit board 5. In this embodiment, two locking members 6 are provided to correspond to the two fixing holes 441 (and two corresponding through holes 51) respectively. As shown in FIG. 13, the second heat dissipation member 42 is located on the upper side of the inner shell 31 and the outer shell 32 and abuts the top wall 321. The first heat dissipation members 41 are fixed to the circuit board 5 via the locking members 6, and are thus simple to mount and detachable.

Figure 18:
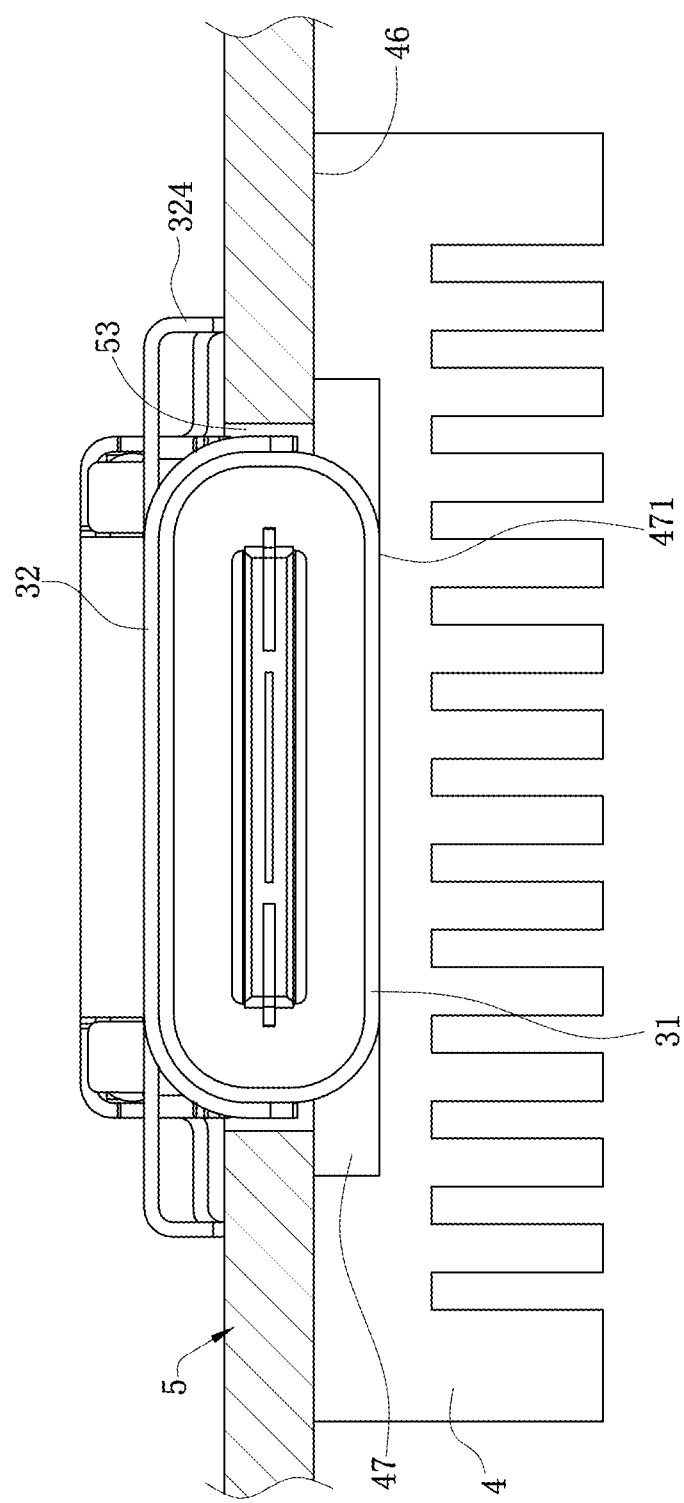
FIG. 18 is a front view of the electrical connector according to the seventh embodiment of the present invention.

FIG. 4 shows a fifth embodiment of the present invention, which is different from the fourth embodiment in that the heat dissipation members 4 are located on at least one side of the left side, the right side and the lower side of the inner shell 31 and the outer shell 32. In this embodiment, specifically, two heat dissipation members 4 are respectively located on the left side and the right side of the inner shell 31 and the outer shell 32, and the two heat dissipation members 4 respectively abut the two side walls 322. Since the existing electrical connector on the market is not provided with a shell behind the insulating body 1, this embodiment is more suitable for the electrical connector 100 not provided with a shell behind the insulating body 1, so that the heat inside the electrical connector 100 is dissipated to the outside and the circuit board 5 via the heat dissipation members 4 on the left side and the right side of the inner shell 31 and the outer shell 32. As shown in FIG. 18, in another embodiment, the heat dissipation member 4 is located on the lower side of the inner shell 31 and the outer shell 32, and the heat dissipation member 4 abuts the bottom surface of the inner shell 31. The heat dissipation member 4 is located on the lower side of the inner shell 31 and the outer shell 32 to save the space above the circuit board 5, so that more components can be disposed on the circuit board 5.

Figure 14:
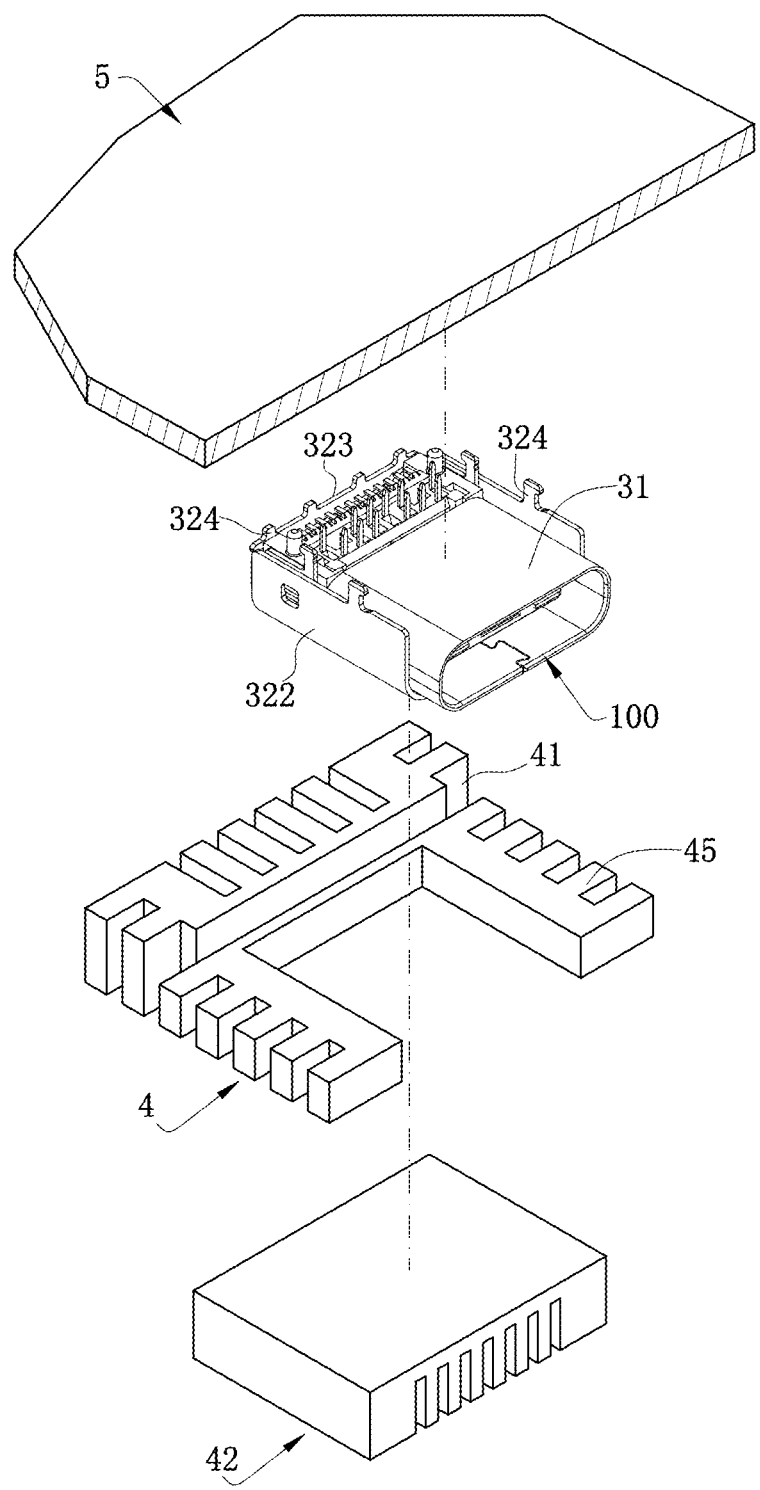
FIG. 14 is a perspective exploded view of the electrical connector according to a sixth embodiment of the present invention.
Figure 15:
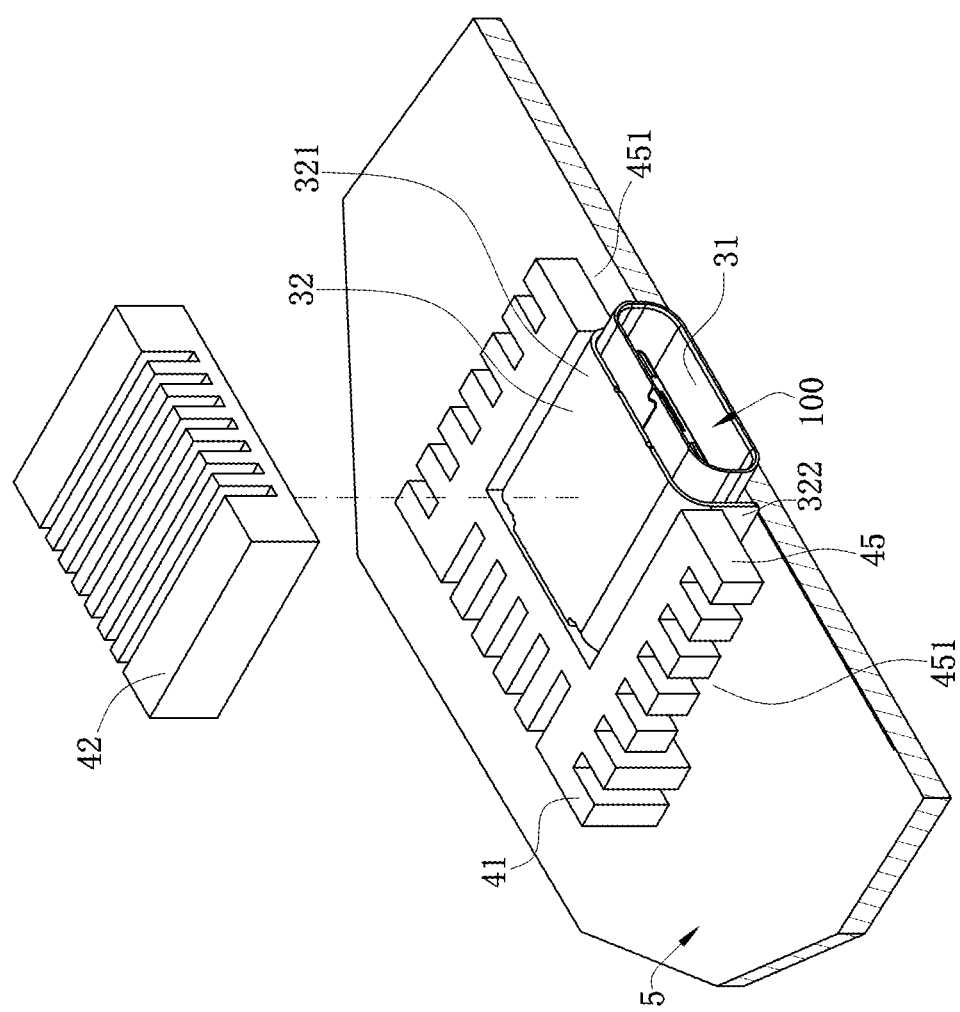
FIG. 15 is a perspective exploded view of another state of the electrical connector according to the sixth embodiment of the present invention.
Figure 16:
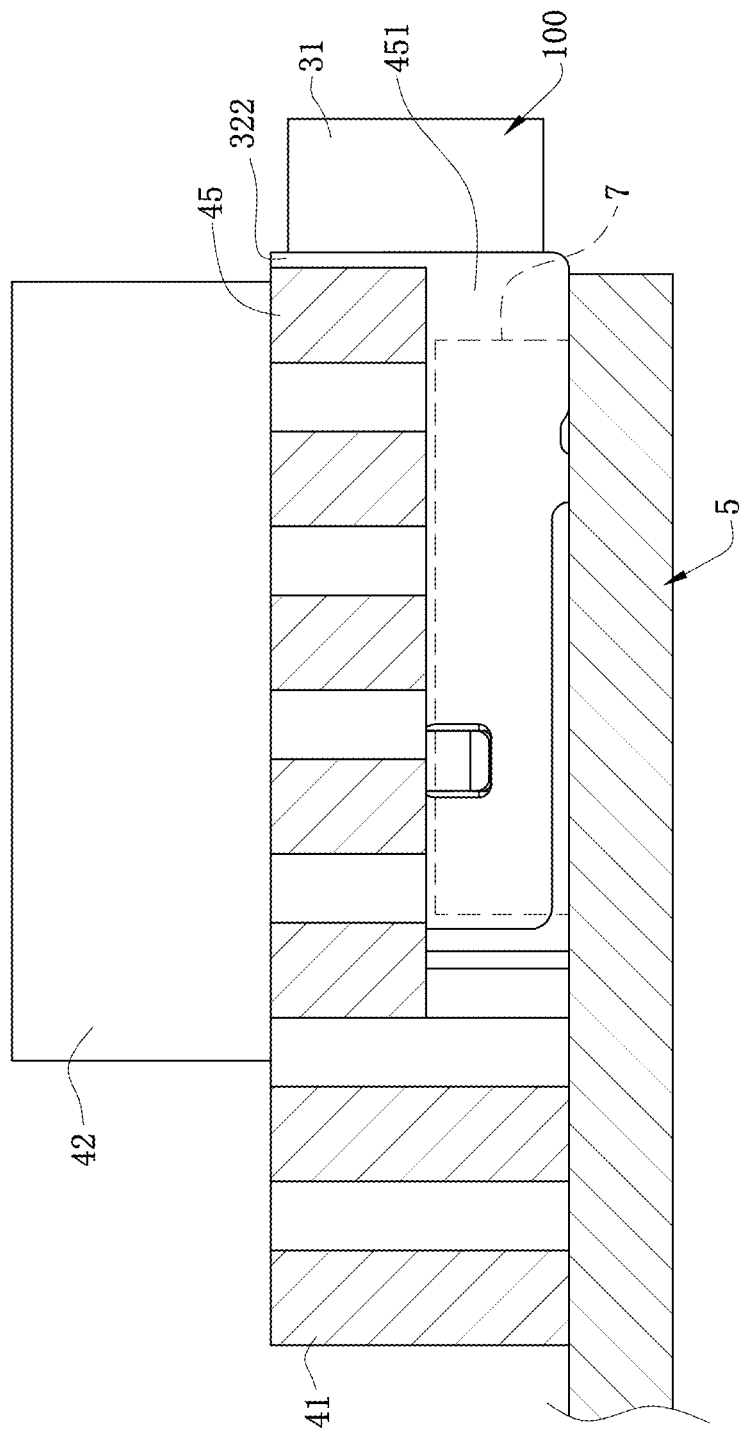
FIG. 16 is a side view of the electrical connector according to the sixth embodiment of the present invention.

FIGS. 14, 15 and 16 show a sixth embodiment, which is different from the fifth embodiment in that the first heat dissipation members 41 are located on the left side, the right side and the rear side of the inner shell 31 and the outer shell 32, and the first heat dissipation members 41 abut the side walls 322 and the rear wall 323. Each first heat dissipation member 41 is provided with a reserved portion 45 not abutting the circuit board 5, and the reserved portion 45 is spaced away from the circuit board 5 to form a reserved space 451 for disposing an electronic component 7. The reserved space 451 is used for arranging the electronic component 7, so that the space on the circuit board 5 is sufficiently utilized and more electronic components 7 can be disposed on the circuit board 5.

FIGS. 17 and 18 show a seventh embodiment of the present invention, which is different from the sixth embodiment in that the heat dissipation member 4 is located on the upper side or the lower side of the inner shell 31 and the outer shell 32. In this embodiment, the circuit board 5 is provided with a sunken plate groove 53, and the electrical connector 100 is mounted in the sunken plate groove 53. The heat dissipation member 4 is located on the lower side of the inner shell 31 and the outer shell 32, and the mounting legs 324 penetrate through the mounting holes in the circuit board 5 to abut the heat dissipation member 4. The heat dissipation member 4 is provided with a first abutting surface 46 for abutting the circuit board 5. Further, the heat dissipation member 4 is recessed corresponding to the inner shell 31 and the outer shell 32 to form a recessed space 47, and the heat dissipation member 4 is provided with a second abutting surface 471 located in the recessed space 47. The bottom surface of the inner shell 31 abuts the second abutting surface 471 in the recessed space 47. The heat dissipation member 4 is provided with the recessed space 47 to reduce the height thereof in the vertical direction, so that the heat dissipation member 4 can be applied to more products.

Figure 19:
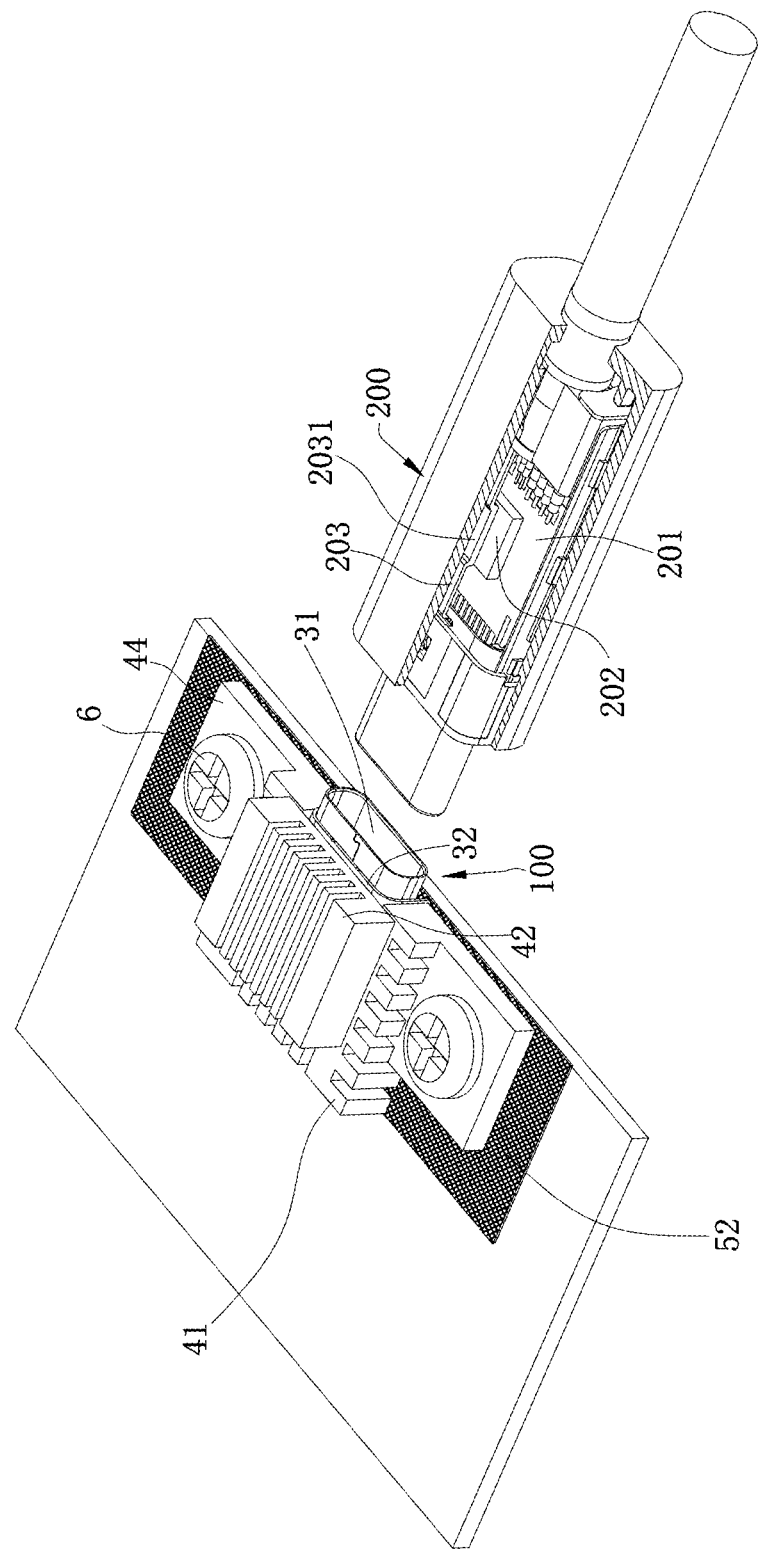
FIG. 19 is a perspective assembled view of an electrical connector according to an eighth embodiment of the present invention.

FIG. 19 shows an eighth embodiment of the present invention, which is different from the seventh embodiment in that the circuit board 5 is provided with a metal layer 52. In this embodiment, the metal layer 52 is a copper foil. The heat dissipation member 4 and the electrical connector 100 are respectively mounted on the metal layer 52. The heat dissipation member 4 abuts the metal layer 52, and the inner shell 31 and the outer shell 32 abut the metal layer 52. The metal layer 52 enlarges the heat dissipation area of the heat dissipation member 4, the inner shell 31 and the outer shell 32, and the heat inside the electrical connector 100 is transferred to the outside and the circuit board 5 more quickly via the heat dissipation member 4 and the metal layer 52, so that the heat dissipation is accelerated and the stable operation of the electrical connector 100 is ensured.

To sum up, the electrical connector 100 according to certain embodiments of the present invention has the following advantages:

(1) The electrical connector 100 of the present invention is provided with the heat dissipation members 4 on one side of or more sides of the shielding shell 3. The heat dissipation members 4 simultaneously abut the shielding shell 3 and the circuit board 5, and the heat generated in the operation of the electrical connector 100 is transferred to the heat dissipation members 4 via the shielding shell 3 and then transferred to the outside and the circuit board 5 by means of the heat dissipation members 4, so that the heat dissipation efficiency of the electrical connector 100 is improved, and the stable operation of the electrical connector 100 is ensured. The heat dissipation members 4 simultaneously abut the shielding shell 3 and the circuit board 5 to reduce the size of the heat dissipation members 4 and save the space on the circuit board 5.

(2) The heat dissipation member 4 is located on one side of the inner shell 31 and the outer shell 32. When the electrical connector 100 is mated with the mating connector 200, the metal shell 203 abuts the inner shell 31 and the grounding sheet 8. The metal shell 203 transfers the heat to the inner shell 31, then the inner shell 31 further transfers the heat to the outer shell 32, and the outer shell 32 transfers the heat to the outside and the circuit board 5 via the heat dissipation member 4, thereby accelerating the heat dissipation of the electrical connector 100 and ensuring that the electrical connector 100 operates stably.

(3) There are two heat dissipation members 4. The two heat dissipation members 4 are respectively located on the left side and the right side of the inner shell 31 and the outer shell 32, and the two heat dissipation members 4 are disposed separately. By providing multiple heat dissipation members 4 in the transverse direction of the inner shell 31 and the outer shell 32, the heat inside the electrical connector 100 is transferred to the outside and the circuit board 5 more quickly via the heat dissipation members 4, so that the heat dissipation is accelerated and the stable operation of the electrical connector 100 is ensured.

(4) The first heat dissipation member 41 is located on the rear side of the inner shell 31 and the outer shell 32, the second heat dissipation member 42 is located on the upper side of the inner shell 31 and the outer shell 32, and the first heat dissipation member 41 and the second heat dissipation member 42 are disposed separately. By providing multiple heat dissipation members 4 in the transverse direction and the vertical direction of the inner shell 31 and the outer shell 32, the heat inside the electrical connector 100 is transferred to the outside and the circuit board 5 more quickly via the plurality of heat dissipation members 4, so that the heat dissipation is accelerated and the stable operation of the electrical connector 100 is ensured.

(5) The first heat dissipation members 41 are located on the left side, the right side and the rear side of the inner shell 31 and the outer shell 32, and the first heat dissipation members 41 abut the side walls 322 and the rear wall 323. Two fixing portions 44 respectively extend out of the left and right sides of the first heat dissipation member 41, and each fixing portion 44 is provided with a fixing hole 441. The circuit board 5 is provided with at least one through hole 51 corresponding to the fixing holes 441, and a locking member 6 penetrates through one of the fixing holes 441 and a corresponding one of the through holes 51 to fix the first heat dissipation members 41 to the circuit board 5. The first heat dissipation members 41 are fixed to the circuit board 5 via the locking members 6, and are thus simple to mount and detachable.

(6) The two heat dissipation members 4 are respectively located on the left side and the right side of the inner shell 31 and the outer shell 32, and the two heat dissipation members 4 respectively abut the two side walls 322. Since the existing electrical connector on the market is not provided with a shell behind the insulating body 1, this design is more suitable for the electrical connector 100 not provided with a shell behind the insulating body 1, so that the heat inside the electrical connector 100 is dissipated to the outside and the circuit board 5 via the heat dissipation members 4 on the left side and the right side of the inner shell 31 and the outer shell 32.

(7) The heat dissipation member 4 is located on the lower side of the inner shell 31 and the outer shell 32, and the heat dissipation member 4 abuts the bottom surface of the inner shell 31. The heat dissipation member 4 is located on the lower side of the inner shell 31 and the outer shell 32 to save the space above the circuit board 5, so that more components can be disposed on the circuit board 5.

(8) The circuit board 5 is provided with the sunken plate groove 53, and the electrical connector 100 is mounted in the sunken plate groove 53. The heat dissipation member 4 is located on the lower side of the inner shell 31 and the outer shell 32, and the mounting legs 324 penetrate through the mounting holes in the circuit board 5 to abut the heat dissipation member 4. The heat dissipation member 4 is provided with a first abutting surface 46 for abutting the circuit board 5. Further, the heat dissipation member 4 is recessed corresponding to the inner shell 31 and the outer shell 32 to form a recessed space 47, and the heat dissipation member 4 is provided with a second abutting surface 471 located in the recessed space 47. The bottom surface of the inner shell 31 abuts the second abutting surface 471 in the recessed space 47. The heat dissipation member 4 is provided with the recessed space 47 to reduce the height thereof in the vertical direction, so that the heat dissipation member 4 can be applied to more products.

(9) The circuit board 5 is provided with the metal layer 52, and the metal layer 52 is a copper foil. The heat dissipation member 4 and the electrical connector 100 are respectively mounted on the metal layer 52. The heat dissipation member 4 abuts the metal layer 52, and the inner shell 31 and the outer shell 32 abut the metal layer 52. The metal layer 52 enlarges the heat dissipation area of the heat dissipation member 4, the inner shell 31 and the outer shell 32, and the heat inside the electrical connector 100 is transferred to the outside and the circuit board 5 more quickly via the heat dissipation member 4 and the metal layer 52, so that the heat dissipation is accelerated and the stable operation of the electrical connector 100 is ensured.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. An electrical connector, configured to be electrically connected to a circuit board, comprising:
   an insulating body;
   a plurality of terminals, accommodated in the insulating body;
   a conductive shielding shell, accommodating the insulating body and configured to be mounted to the circuit board; and
   at least one heat dissipation member, located on at least one side of the shielding shell, wherein the at least one heat dissipation member simultaneously abuts the circuit board and the conductive shielding shell;
   wherein there are at least two heat dissipation members, and the at least two heat dissipation members are located on at least two sides of the conductive shielding shell in a transverse direction and formed integrally or disposed separately.

2. The electrical connector of claim 1, wherein there are two heat dissipation members, and the two heat dissipation members are respectively located on a left side and a right side of the shielding shell and disposed separately.

3. The electrical connector of claim 1, wherein there are two heat dissipation members, and the two heat dissipation members are respectively located on a left side and a rear side of the shielding shell and disposed integrally.

4. The electrical connector of claim 1, wherein there are three heat dissipation members, and the three heat dissipation members are respectively located on a left side, a right side and a rear side of the shielding shell and formed integrally.

5. The electrical connector of claim 1, wherein the at least one heat dissipation member comprises at least one first heat dissipation member and at least one second heat dissipation member, the at least one first heat dissipation member is located on at least one side of the shielding shell in a transverse direction, the at least one second heat dissipation member is located on at least one side of the shielding shell in a vertical direction, and the at least one first heat dissipation member and the at least one second heat dissipation member are disposed integrally or separately.

6. The electrical connector of claim 5, wherein the at least one first heat dissipation member is located on a rear side of the shielding shell, the at least one second heat dissipation member is located on a upper side of the shielding shell, and the at least one first heat dissipation member and the at least one second heat dissipation member are disposed separately.

7. The electrical connector of claim 1, wherein the at least one heat dissipation member is provided with a reserved portion not abutting the circuit board, and the reserved portion is spaced away from the circuit board to form a reserved space.

8. The electrical connector of claim 1, wherein the at least one heat dissipation member is located on an upper side or a lower side of the shielding shell, the at least one heat dissipation member is provided with a first abutting surface abutting the circuit board, the at least one heat dissipation member is recessed to form a recessed space and is provided with a second abutting surface located in the recessed space; and the shielding shell abuts the second abutting surface in the recessed space.

9. The electrical connector of claim 1, wherein the shielding shell comprises an inner shell and an outer shell, the inner shell is accommodated in the insulating body, and the outer shell is sleeved over the inner shell and provided with at least one mounting leg configured to fix the outer shell to the circuit board.

10. The electrical connector of claim 1, wherein the insulating body is provided with a base and a tongue extending forward from the base, and the terminals are retained to the base in an upper row and a lower row and partially exposed to an upper surface and a lower surface of the tongue.

11. An electrical connector, configured to be electrically connected to a circuit board, comprising:
    an insulating body;
    a plurality of terminals, accommodated in the insulating body;
    a conductive shielding shell, accommodating the insulating body and configured to be mounted to the circuit board; and
    at least one heat dissipation member, located on at least one of a left side, a right side and a lower side of the shielding shell, wherein the at least one heat dissipation member simultaneously abuts the circuit board and the conductive shielding shell;
    wherein there are at least two heat dissipation members, and the at least two dissipation members are respectively located on at least two sides of the left side, the right side and the lower side of the conductive shielding shell.

* * * * *